United States Patent [19]

Merkel

[11] Patent Number: 4,965,606
[45] Date of Patent: Oct. 23, 1990

[54] ANTENNA SHROUD TEMPEST ARMOR

[76] Inventor: Miles A. Merkel, 2240 Golf Links Rd., Sierra Vista, Ariz. 85635

[21] Appl. No.: 311,833

[22] Filed: Apr. 14, 1989

Related U.S. Application Data

[63] Continuation-in-part of Ser. No. 66,040, Jun. 24, 1987, abandoned.

[51] Int. Cl.⁵ ............................................. G01R 3/00
[52] U.S. Cl. .................................... 343/703; 343/841; 343/872
[58] Field of Search ....................... 343/703, 841, 872; 174/35 MS

[56] References Cited

U.S. PATENT DOCUMENTS

| | | | |
|---|---|---|---|
| 3,286,264 | 11/1966 | Miley | 343/703 |
| 4,110,552 | 8/1978 | Lombardi | 174/35 MS |
| 4,134,119 | 1/1979 | Sandoz et al. | 343/703 |
| 4,189,618 | 2/1980 | Bretts et al. | 174/35 MS |

Primary Examiner—Rolf Hille
Assistant Examiner—Hoanganh Le

[57] ABSTRACT

An electromagnetically stable, portable, cost-effective, multi-shell metallic device completely enclosing the path between radiator and probe, preventing unwanted interference, tempest compromise and human irradiation.

3 Claims, 1 Drawing Sheet

ANTENNA SHROUD TEMPEST ARMOR

GOVERNMENT SUPPORT

Part of the invention herein claimed "which preserves the signal's modulation and phase characteristics and which exhibits freedom from external interference" was developed in the course of a contract with the Department of the U.S. Army.

BACKGROUND AND CROSS REFERENCE TO RELATED APPLICATIONS (37 C.F.R. 1,77 (c) (1))

This application is a continuation-in-part of Ser. No. 07/066,040 filed on June 24, 1987, now abandoned.

BACKGROUND

1. Field of Invention

This invention relates to stable and repeatable transfer and delivery of precisely quantified attenuation and phase characteristics of, precisely calibrated electromagnetic containment of, and protection from electromagnetic contamination of, radiated electromagnetic energy on test paths between electromagnetic energy radiators, or "feeds", and electromagnetic energy receiving antennas, or "probes". All of this in a cost-effective and portable manner which is physiologically safe for the human operator.

2. Discussion of Prior Art

The shrouding, or protection, of radiated electromagnetic wave energy along a desired test path(s) has significance from several aspects: The radiated energy generally contains extractable intelligence. It is desirable that said radiated energy be restricted to a path(s) which is/are under rigid control of authorized testing personnel. Radiation of said energy should not be allowed to interfere with other electronic components or systems nor be allowed to irradiate testing personnel beyond the threshold set by the Surgeon General of the United States. Radiated electromagnetic energy from external sources should not be allowed to interfere with the test path(s). When said radiated electromagnetic wave energy, on desired path(s), is classified, an added stringency requires said energy be sufficiently controlled as to deny unauthorized access to said radiated intelligence.

Any device(s) which accomplishes the preceding should have performance characteristics which: are fully quantifyable to any accuracy and precision; are stable over any length of measurement period, and; are repeatable. The device(s) should be cost-effective, portable, and provide electromagnetic shielding to protect against potentially dangerous human operator irradiation.

Miley, Calvin W., "ANTENNA TEST SHIELD", U.S. Pat. No. 3,286,264

The Miley device is a Power Meter Head, very specifically designed for a very specific application, i.e., the coupling of power directly from a space vehicle telemetry antenna to a Power Meter, much as one would touch a light bulb to detect heat (power): If the light bulb is hot, power is ON. . . if the light bulb is not hot, power is OFF. Rationalle supporting the fact that the Merkel invention is unique, in re the Miley reference, follows:

A. The Miley reference teaches that "Brass has been successfully used as the material for this cylinder. However, any conducting material having the required characteristics may be used." A person of ordinary skill would not know exactly what might be "required characteristics." The absolute permeability, absolute conductivity and attenuation factors of brass make it transparent to the low-impedance H field, and places brass in the same category as annealed copper, soft aluminum and lead. Shielding characteristics for brass and copper, as well as for several commonly available magnetic materials, which do indeed shield against the H field, shown in the following table, proves conclusively that only through use of a multiple shell metal barrel can shielding be accomplished.

| MATERIAL | ABSOLUTE PERMEABILITY | ABSOLUTE COMDUCTIVITY | ATTENUATION FACTOR |
|---|---|---|---|
| Brass | $1.26 \times 10^{-8}$ | $1.51 \times 10^5$ | $2.35 \times 10^{-4}$ |
| Copper | $1.26 \times 10^{-8}$ | $5.80 \times 10^5$ | $1.20 \times 10^{-4}$ |
| Mumetal | $2.51 \times 10^{-4}$ | $1.68 \times 10^4$ | 0.10 |
| AD-MU-80 (TM) | $6.29 \times 10^{-4}$ | $1.82 \times 10^4$ | 0.15 |

B. The Miley reference teaches that the ". . . shield body 10 is fitted over a nose cone stub antenna 12, which acts as the center conductor.". Several points are important here: First, the significant difference between an antenna and a feed and, Second, that which is reportedly measured in the Miley reference.

An antenna is a device possessing characteristics of directivity and efficiency and which radiates electromagnetic energy as a function of direction. Antenna field regions must be defined very carefully. Optical terms, frequently used very loosely, are inadequate. The space around antennas is divided into three regions: (1) the Reactive Near-Field Region, that space immediately surrounding the antenna where the reactive components predominate; (2) the Radiating Near-Field Region, where the radiation pattern is dependent on the distance from the antenna, and; (3) the Far-Field Region, where the relative phase and amplitude relationships between the field contributions from different elements of the antenna asymptotically approach a fixed relationship, and the relative angular distribution of the field becomes independent of the distance. These relationships are available from any competent text on antenna engineering.

The Miley reference, with operation restricted to the Reactive, Near-Field Region, where reactive components (E-Field and H-Field) predominate, ". . . relates to a method and equipment for monitoring power output of the telemetry transmission system on space probe vehicles, . . .". As such, the Miley reference can detect only whether the telemetry transmitter is turned ON or OFF.

The Merkel invention is designed to provide ". . . stable and repeatable transfer and delivery of precisely quantified attenuation and phase characteristics of, precisely calibrated electromagnetic containment of, and protection from electromagnetic contamination of, radiated electromagnetic energy on test paths between electromagnetic energy radiators, or "feeds", and flush mounted electromagnetic energy receiving antennas, or "probes". Thus, to anyone knowledgeable in electromagnetics, the Merkel invention is designed to precisely analyse and define the performance of any receiving system, whereas the Miley device detects only whether a specific telemetry transmitter is turned ON or OFF.

From the preceding, it is evident that the Miley device is not treating the ". . . telemetry nose stub antenna. . ." as an antenna or as a feed. The Miley device is direct coupling energy into a power meter and detecting whether the telemetry transmitter is turned ON or OFF.

C. The Miley reference teaches that "A disc 20, which may be plastic or other suitable material, is fitted into the tapered cylinder 10 adjacent, but spaced from the cap 16, providing a support for the lumped constants unit.".

The "disc (20)" is intended as a spacing (insulating) washer to hold the "lumped constants unit" in place, and is not intended to serve an electromagnetic gasketting function. It is also noted that a person of ordinary skill would not know what "other suitable material" consists of.

D. Nowhere in the Miley reference is electromagnetic gasketting addressed. In fact, the flange end of the shield is referred to in the claims as ". . . flared to the pitch of the nose cone to fit firmly thereon and to provide mechanical stability and electrical grounding. . .", hence the Miley reference specifically states that no gasketting of any kind is intended, or allowed, (at the time of the claims or at any future time) since introduction of gasketting material of any kind whatsoever would destroy the effect of ". . . electrical grounding. . .".

It is therefore evident that the Miley device will provide no shielding against radiation of the E and H fields since a physical inhomogeneous interface bond results between the mating members (nose cone/Miley device). The interface connection is not continuous and there results a bowing or waviness between the connected edges. This develops slits or gaps which leads to electromagnetic leakage radiation at frequencies approaching 0.01 wavelengths.

E. In summary, the Miley device detects whether a specific telemetry transmitter is turned ON or OFF. Some indication of relative (unspecified and uncalibrated) transmitter power delivered to the antenna is obtained from the Power Meter. Determination of the radiation performance, if any, (second paragraph of B above pertains) of the specific telemetry antenna is left to other means for determination.

Wilson, William J., "HIGH FREQUENCY TRANSMISSION LINE COUPLING DEVICE," U.S. Pat. No. 2,994,083

The Wilson reference is a device for coupling electromagnetic energy from a flat-strip line to a circular line and the converse, and is specifically restricted to high frequencies (nominally 3 MHz to 30 MHz). It does not purport to: provide a device enhancing measurement of electromagnetic energy on radiation test paths between electromagnetic energy feeds and electromagnetic energy receiving antennas; provide a device whose electromagnetic performance can be quantified to any desired degree of accuracy and precision; be a test device; be capable of repeatable measurements; have any shielding protection (to or from the coupling mechanism); be portable; be cost-effective. In summary, the claims of this reference have no relationship, expressed or implied, to the Merkel invention.

Halstead, W.S., "ANTENNA STRUCTURE WITH AN INTEGRATED AMPLIFIER RESPONSIVE TO SIGNALS OF VARIED POLARIZATION," U.S. Pat. No. 3,523,251

The Halstead invention is a helix receiving antenna employing preamplification at the antenna to overcome the usual degradation in signal-plus-noise to noise ratio encountered with any reasonably long transmission line. The helix antenna was first introduced by E. M. Turner in 1954 and, since then, its development has been principally empirical, with theoretical work being qualitative and based primarily on the band theory given by Burdine in 1955. The helix antenna was studied to extreme during the 1950's and particularly in the 1960's partially because of its small size and relative insensitivity to polarization; however, helix antennas are either right-circularly or left-circularly polarized and the Halstead reference does not address this important factor.

The necessity for preamplification at the physical location of communication system receiving antenna output terminals has been recognized since at least the time of Friis's proposal of a Noise Figure of Radio Receivers in 1944. This is particularly true if one desires, or needs, to maintain an acceptably high signal-plus-noise to noise ratio from antenna to receiver, especially if the received signal is weak and/or the transmission line contributes a significant amount of system noise. I personally documented this phenomenon in 1964 as a minor element in a report to the Undersecretary of Defense for Research and Development titled "Receiving Characteristics of a Circularly Disposed Antenna Array versus Two Nearby Rhombic Antenna Farms on the Island of Okinawa during an Intense Drought."

In summary, the Halstead reference, obvious from published literature of the time, perhaps has some utility; however, it has no relationship, explicit or implied, to the Merkel invention. It does not purport to: provide a device enhancing measurement of electromagnetic energy on radiation test paths between electromagnetic energy feeds and electromagnetic energy receiving antennas; provide a device whose electromagnetic performance can be quantified to any desired degree of accuracy and precision; be a test device; be capable of repeatable measurements; have any shielding protection (to or from the "antenna structure"); be portable; or be cost effective.

Kuecken, John A., "GROUND INDEPENDENT ANTENNA", U.S. Pat. No. 3,750,181

The Kuecken reference is an antenna, purportedly an improved ground independent antenna. What it is not, and what it does not purport to do is: provide a device enhancing measurement of electromagnetic energy on radiation test paths between electromagnetic energy feeds and electromagnetic energy receiving antennas; provide a device whose electromagnetic performance can be quantified to any desired degree of accuracy and precision; be a test device; be capable of repeatable measurements; have any shielding protection, to or from anything; be portable; or be cost effective.

Stark, Louis, "HIGH-RESOLUTION HEMISPHERICAL REFLECTOR ANTENNA," U.S. Pat. No. 3,852,748

The Stark invention appears to be an excellent design for a multi-beam microwave antenna; however, it has absolutely no expressed or implied relation to the Merkel invention. The Merkel invention is not a design of an antenna.

Sandoz, Oscar A., "ANTENNA TEST SHIELD", U.S. Pat. No. 4,134,119

The Sandoz reference is specifically designed for a quarter-wave, monopole VHF (30 MHz to 300 MHz) homing antenna "... upstanding from a ground-plane surface." The Merkel invention is designed to deliver precisely quantified energy to flush mounted antennas, operating in the frequency range 2 GHz and higher.

The significance is that the Sandoz reference "RF coupling means" 25 is not designed, intended or capable of "coupling" electromagnetic energy into a flush mounted antenna in any quantifiable form. It is designed for use with, and only with, a "¼ wave, monopole VHF Emergency Locator Transmitter (ELT) of a type used aboard aircraft".

The Sandoz reference teaches that "Effective electromagnetic shieldiing was obtained by providing a mechanical connection between the shield 13 and the aircraft skin by way of the flexible contacts 36 and the screws 37." This is vague because the words "effective electromagnetic shielding" are indefinite; a person of ordinary skill would not know exactly what might be effective electromagnetic shielding. As also explained elsewhere in this communication, no shielding of either the H field or E field waves is accomplished by the Sandoz reference as frequency approaches 0.01 wavelengths. The significance of this becomes apparent when one realizes that 0.01 wavelengths at 300 MHz is 1.0 centimeter, and at 30 MHz is 10 centimeters, which is well within the order of dimensions of the Sandoz reference.

The Sandoz reference teaches that "the dimensions of the shields 12 and 13 are not critical.". The dimensions of the Merkel invention are very critical and form a part of the invention.

The Sandoz reference teaches that "Rigid aluminum is recommended for the construction of the coupler 10 ...". As previously pointed out in this communication, aluminum is a good shield against the high impedance E field waves, but is transparent to the low impedance H field waves. Hence there is no electromagnetic shielding in the Sandoz reference.

The Sandoz reference teaches that "The lapped over portion of the screen 14 is secured to the shield 12 with rivets 15 which are spaced uniformly around the periphery of the shield so that the screen completely encloses the antenna 11 for optimized shielding. The lowermost end of the shield is effectively closed off by the surface 24." The Sandoz reference will provide no electromagnetic shielding against radiation of the E and H fields since a physical inhomogeneous interface bond results between the mating members at both ends of the so-called shield. The interface connections are not continuous and there results a bowing or waviness between the connected edges. This develops slits or gaps which leads to electromagnetic radiation at frequencies approaching 0.01 wavelengths.

The Sandoz reference teaches that "A metal gasket 35 fits around the periphery of the opening 33 and is fastened to the disc 31 by means of rivets 15. The free ends of the copper mesh wall 30 are sandwiched between the gasket 35 and the disc 31 to ensure good electrical contact with the shield." As shown in the previous paragraph, this will provide no electromagnetic shielding against radiation of the E and H fields since a physical inhomogeneous interface bond results, hence, the Sandoz reference neither implicitly nor explicitly teaches that EMI gasketting is to be used. This is further reinforced when the Sandoz reference teaches that "... locknut 18 may be threaded onto its stud until a flange 16 contacts the surface 24.", creating an obvious metal-to-metal contact which provides no electromagnetic shielding.

The Sandoz reference provides a device which serves some useful function in terms of a "check-out" of a quarter-wave, monopole VHF homing antenna protruding from an aircraft and appended to an Emergency Locator Transmitter (ELT) of a type used aboard aircraft. The precise function it performs is not clear. It does not, however, have any useful function(s) that relate to the Merkel invention claims.

Murdock, Arthur, W., "DIRECTIONAL ANTENNA SHIELD FOR A SLOTTED OPENING", U.S. Pat. No. 4,189,730, and Smith, Philip, H., "CLUTTER FENCE FOR SUPPRESSION OF ELECTROMAGNETIC ENERGY", U.S. Pat. No. 3,683,394.

Restriction of acceptable direction of arrival of electromagnetic energy is taught in both of these inventions. Smith's patent teaches that unwanted energy arriving from ground objects can be blocked by use of a clutter fence. Said energy is blocked in a horizontal band having a vertical height equal to one-half the diameter of the first Fresnel zone of the antenna. Murdock's patent teaches that unwanted energy arriving from directions other than the said invention's elongated slotted opening will be blocked and further that said desired energy arriving at said invention's elongated, slotted opening will be accepted.

The Smith invention accepts undesired as well as desired energy from all possible arrival angles, and the Murdock invention accepts energy, undesired as well as desired, from the direction of said elongated, slotted opening. Both inventions allow exit of desired energy, hence free access to anyone desiring acquisition of said radiated intelligence.

None of these inventions has any relationship to the Merkel invention.

OBJECTS AND ADVANTAGES OF THE INVENTION

Objects and Advantages

Accordingly, I claim the following as my objects and advantages of the invention: the provision of a stable device which provides repeatable transfer and delivery of precisely quantified and calibrated attenuation and phase characteristics of, precisely calibrated electromagnetic containment of, and protection from electromagnetic contamination of, radiated electromagnetic energy on test paths between electromagnetic energy radiators, or "feeds", and flush mounted electromagnetic energy receiving antennas, or "probes".

It is noted at this point that the terms "feed" and "probe" have been used to differentiate between a feed, a probe and an antenna. Neither a feed nor a probe is an antenna when its mode of operation is in the Reactive Near-Field Region, that space immediately surrounding the antenna where the reactive components (E-Field and H-Field) predominate. Confusion arises because "antennas" are usually designed for operational use in the Far-Field Region, however, evaluation of performance prior to deployment is desirable in the Reactive Near-Field Region.

The precise quantification of attenuation and phase characteristics permits precise quantification of the E-Field and H-Field wave energy arriving at the "probe", thus permitting mathematical simulation of the Far-Field Region performance of the "probe". The antenna performance is thus evaluated while it is in a "probe" testing environment.

I further claim a portable device which virtually eliminates the requirement for screen room or anechoic chamber; a device orders-of-magnitude more cost-effective than said screen room or anechoic chamber; a device having protection against escape of electromagnetic energy causing potential security compromise as specified in Department of Defense regulations dealing with TEMPEST matters; a device giving protection against escape of electromagnetic energy causing potential interference to other electromagnetic energy paths; a device giving protection against intruding electromagnetic energy; a device giving protection to humans against potentially harmful electromagnetic irradiation.

Readers will find further objects and advantages of the invention from a consideration of the ensuing description and the accompanying drawings.

BRIEF DESCRIPTION OF THE SEVERAL VIEWS OF THE DRAWING

Drawing Figure

Figure 1:
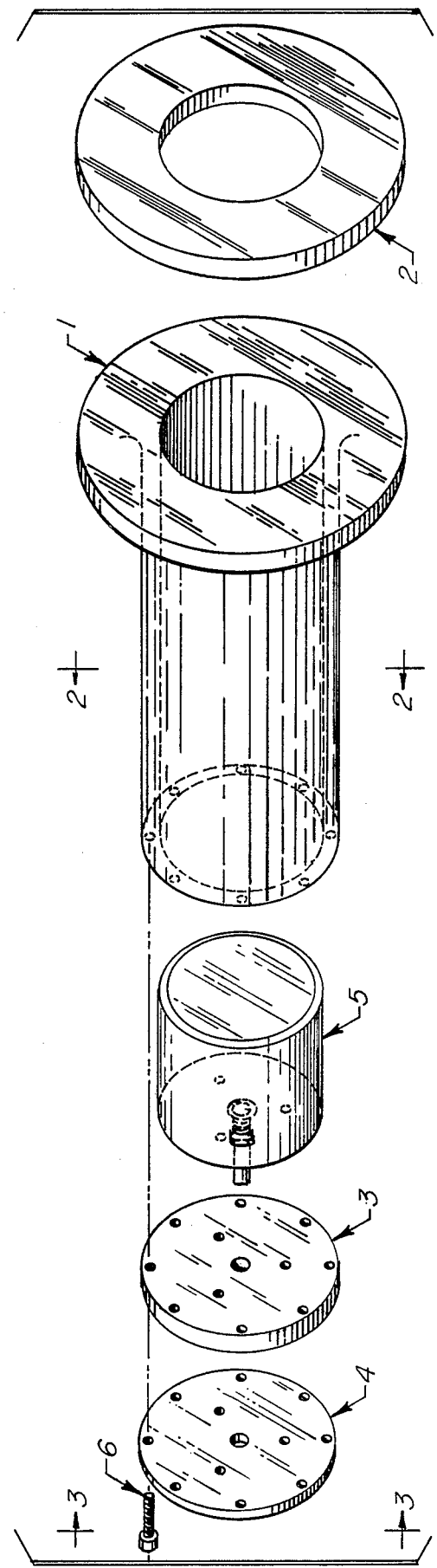
FIG. 1 shows an exploded view of the antenna shroud tempest armor.

DRAWING REFERENCE NUMERALS 1 barrel
2 electromagnetic interference gasket A
3 electromagnetic interference gasket B
4 end cap
5 feed
6 fasteners
7 outer metal wall of barrel 1
8 electromagnetic wave air gap
9 inner metal wall of barrel 1
10 clearance hole
11 feed connector
12 clearance hole
13 fastener
14 strap, non-conducting.
15 metal washer
16 nut and bolt fastener

BRIEF DESCRIPTION OF DRAWINGS OF ANTENNA SHROUD TEMPEST ARMOR

For a better understanding of the present invention, together with other and further objects thereof, reference is made to the following description taken in connection with the accompanying drawings and its scope will be pointed out in the appended claims.

In the drawings:

FIG. 1 shows an exploded view of the antenna shroud tempest armor device according to the preferred embodiment of the invention.

Figure 2:
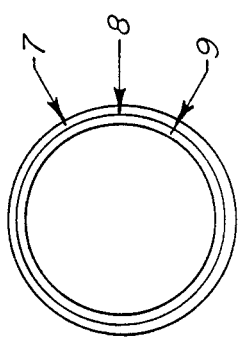

FIG. 2 is a cross-sectional view of the barrel 1 of the antenna shroud tempest armor device taken along the line 2—2 of FIG.

Figure 3:
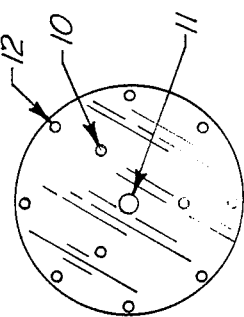

FIG. 3 is an end view of the assembled antenna shroud tempest armor device taken along the line 3—3 of FIG. 1.

Figure 4:
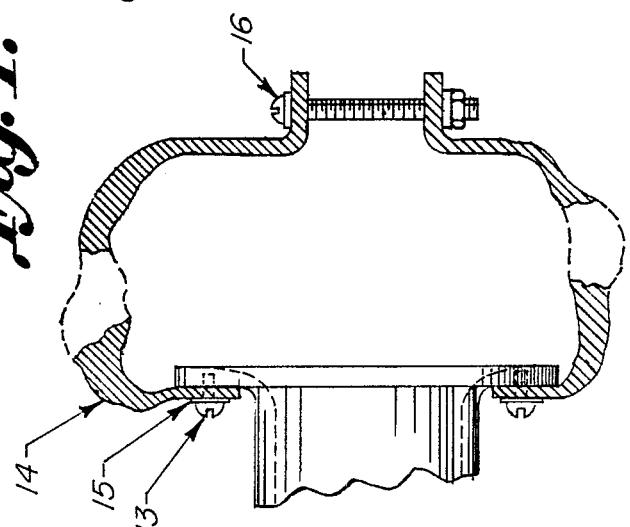

FIG. 4 is a side view of the flanged end of the barrel 1 of FIG. 1, showing detail of the attachment of the non-conducting attachment strap.

SUMMARY OF THE INVENTION

The present invention provides an antenna shroud which in and of itself ensures stable and repeatable transfer of precisely quantified attenuation and phase characteristics of electromagnetic energy on test paths between electromagnetic energy radiators and electromagnetic energy receiving antennas, or "probes", under test. This provides the means of mathematical simulation which precisely determines the Far-Field antenna performance of the electromagnetic energy receiving probe when it is in its normal mode of operation as an antenna.

The antenna shroud of the invention also provides that leakage of electromagnetic radiation from the test path between radiators and receiving antennas is restricted to less than that specified by U.S. Governmental tempest regulations.

The antenna shroud of the invention also provides that leakage of electromagnetic radiation into the test path between radiators and receiving antennas is restricted to less than that which would result in contamination of the test results.

The antenna shroud of the invention also provides that leakage of electromagnetic radiation from the test path between radiators and receiving antennas is restricted to less than that specified by the Surgeon General of the United States of America as acceptable irradiation of humans.

DETAILED DESCRIPTION

Detailed Description of Operation of Antenna Shroud Tempest Armor

Barrel 1 is a multi-shell metal tube flanged on one end and drilled and tapped on the opposite end. Cutaway view of flanged end of barrel 1 is presented in FIG. 4 along with detail of attaching strap 14 (not shown in FIG. 1). The electromagnetic interference gasket A 2 (shown in FIG. 1 but not in FIG. 4) is placed against the flanged end of barrel 1 and held under pressure against the flush mounted electromagnetic energy receiving antenna, or "probe" (not shown) by non-conducting strap 14. The electromagnetic interference gasket A 2 and the flush mounted electromagnetic energy receiving antenna, or "probe", are both situated within the space encircled by the strap 14 and the flanged end of barrel 1.

Non-conducting strap 14 is attached to barrel 1 with fastener 13 and metal washer 15. Strap 14 circles the supporting structure of the "probe" and is placed under tension by nut and bolt fastener 16. Nut and bolt fastener 16 is a very simplistic tensioning device and can be replaced by a more sophisticated device providing easier operation.

Metal end cap 4 and electromagnetic interference gasket B 3 are mounted, through three clearance holes 10 into three tapped holes in feed 5 by fasteners 6 (only one shown). The number of these holes may vary from three, dependent on the preference of the manufacturer of feed 5. This has no impact on the invention. Feed connector 11 on feed 5 slips through centered clearance holes in electromagnetic interference gasket B 3 and end cap 4.

This assembly is then slipped inside barrel 1 and fastened by fasteners 6 through the eight clearance holes 12 in the outer circle of clearance holes in end cap 4 and electromagnetic interference gasket B 3 into the eight tapped holes in barrel 1.

Outer metal wall 7 of barrel 1 and inner metal wall 9 of barrel 1 are composed of dissimilar metals and are separated by an electromagnetic wave air gap 8.

Considering now the operation of the antenna shroud tempest armor of FIGS. 1, 2, 3 and 4, the physical inside dimensions of the barrel 1 are mathematically determined from the operating frequency of the electromagnetic energy receiving antenna, or "probe". The feed 5 then launches electric and magnetic waves into barrel 1. There are an infinite number of families, or modes, of each type of wave and an infinite number of family members, or orders, within each family.

The attenuation and phase constants of the barrel 1 are computed from the physical dimensions and electrical characteristics of barrel 1 and used to precisely determine the characteristics of the electromagnetic energy impinging on the electromagnetic energy receiving antenna, or "probe". The circular cross-section provides superior attenuation properties with a minimum attenuation occurring at some specific frequency. Mathematical design of the inside demensions is made so that this specific frequency is usually the operating frequency of the electromagnetic energy receiving antenna, or "probe".

Inner metal wall 9 of barrel 1 is constructed of a metal with, e.g., absolute permeability of $1.257 \times 10^{-8}$ henry per centimeter and absolute conductivity of, e.g., between $4.5819 \times 10^4$ mho per centimeter and $5.7998 \times 10^5$ mho per centimeter.

Outer metal wall 7 of barrel 1 is constructed of a metal with absolute permeability between, e.g., $1.257 \times 10^{-3}$ henry per centimeter and $6.285 \times 10^{-4}$ henry per centimeter and with absolute conductivity between, e.g., $1.6704 \times 10^4$ mho per centimeter and $1.9139 \times 10^4$ mho per centimeter.

Electromagnetic wave air gap 8 in barrel 1 can be infinitesimally small. The only requirement is that the dissimilar metals of contiguous barrel 1 walls not be molecularly bonded.

The thickness of outer metal wall 7 of barrel 1 and of inner metal wall 9 of barrel 1 is at least ten times the electrical skin depth which is the distance below the surface where the current density has diminished to 1/e of its value at the surface, where e is the Naperian base. Additionally the inner metal wall 9 is thick enough to be mechanically strong enough to be drilled and tapped to accomodate fasteners 6.

Approximately fifty decibels of shielding are achieved in both directions through the barrel 1 walls when constructed of only two dissimilar metals. Reciprocity is not, however, exact. Additional shielding is achieved through addition of more walls.

A third wall on the outside of the outer metal wall 7 of barrel 1 can be utilized. This wall is of the same material as inner metal wall 9 of barrel 1. This process may be continued, adding alternate dissimilar metal walls next to each other until the desired degree of shielding is achieved.

Additional attenuation is accomplished by employing waveguide-beyond-cutoff criteria to the spacing between the eight fasteners 6 which retain the assemblage of the three components of feed 5, electromagnetic interference gasket B 3 and metal end cap 4 to barrel 1. This may change the required number of fasteners 6 from the eight specified in the invention. Attenuation approaching 100 decibels can be achieved by this means. While there have been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A device for containing and shielding radiated electromagnetic energy, specifically, an antenna shroud tempest armour device which provides stable and repeatable transfer and delivery of precisely quantified attenuation and phase characteristics of, precisely calibrated electromagnetic containment of, and protection from electromagnetic contamination of, radiated electromagnetic energy on test paths between electromagnetic energy radiators, flush mounted electromagnetic energy receiving antennas, comprising: a metal barrel, flanged on one end and with a flanged-end electromagnetic interference gasket, and drilled and tapped on the other end; said drilled and tapped end accomodating threaded fasteners; said fasteners holding an assembly consisting of an electromagnetic energy radiating feed, a threaded-fastener-end electromagnetic interference gasket and a metal end plate; said flanged end being pressed against said flanged-end electromagnetic gasket which is in turn pressed against usually flush mounted electromagnetic energy receiving antenna under test; pressure, of said flanged end against said flanged-end electromagnetic interference gasket and thence against said usually flush mounted electromagnetic energy receiving antenna under test, being supplied by an attached nonconducting strap which encircles the said electromagnetic energy receiving antenna being tested; said non-conducting strap having a device for applying tension in said nonconducting strap.

2. The invention as claimed in claim 1, the metal barrel further consisting of at least two dissimilar metals sandwiched together with contiguous surfaces of said metals not molecularly bonded.

3. The invention as claimed in claim 1 having threaded fasteners positioned at distances from each which satisfy waveguide-beyond-cutoff criteria for the operating frequency of said electromagnetic energy receiving antenna under test.

* * * * *